United States Patent
Kim et al.

(10) Patent No.: US 9,881,791 B2
(45) Date of Patent: Jan. 30, 2018

(54) METHOD FOR PRODUCING AN OXIDE FILM USING A LOW TEMPERATURE PROCESS, AN OXIDE FILM AND AN ELECTRONIC DEVICE THEREOF

(71) Applicants: KOREA ELECTRONICS TECHNOLOGY INSTITUTE, Seongnam-si, Gyeonggi-do (KR); CHUNG-ANG UNIVERSITY INDUSTRY-ACADEMY COOPERATION FOUNDATION, Seoul (KR)

(72) Inventors: Yong Hoon Kim, Seongnam-si (KR); Sung Kyu Park, Anyang-si (KR); Min Suk Oh, Seoul (KR); Ji Wan Kim, Seongnam-si (KR)

(73) Assignees: KOREA ELECTRONICS TECHNOLOGY INSTITUTE, Seongnam-si, Gyeonggi-do (KR); CHUNG-ANG UNIVERSITY INDUSTRY-ACADEMY COOPERATION FOUNDATION, Seoul (KR)

( * ) Notice: Subject to any disclaimer, the term of this patent is extended or adjusted under 35 U.S.C. 154(b) by 27 days.

(21) Appl. No.: 14/394,869

(22) PCT Filed: Nov. 30, 2012

(86) PCT No.: PCT/KR2012/010275
§ 371 (c)(1),
(2) Date: Oct. 16, 2014

(87) PCT Pub. No.: WO2013/157715
PCT Pub. Date: Oct. 24, 2013

(65) Prior Publication Data
US 2015/0123115 A1    May 7, 2015

(30) Foreign Application Priority Data

Apr. 16, 2012  (KR) .................... 10-2012-0039035
Nov. 30, 2012  (KR) .................... 10-2012-0137532

(51) Int. Cl.
*H01L 21/02*    (2006.01)
*H01L 21/26*    (2006.01)
(Continued)

(52) U.S. Cl.
CPC .. *H01L 21/02628* (2013.01); *H01L 21/02554* (2013.01); *H01L 21/02565* (2013.01);
(Continued)

(58) Field of Classification Search
CPC ......... H01L 21/02628; H01L 21/02554; H01L 21/02565; H01L 21/02664; H01L 29/7869
(Continued)

(56) References Cited

U.S. PATENT DOCUMENTS 5,630,872 A * 5/1997 Ogi .................... C03C 17/25
                                                        106/287.18
6,146,135 A * 11/2000 Watanabe ............. C23C 8/10
                                                        432/221
(Continued)

FOREIGN PATENT DOCUMENTS

DE   10 2009 054997 B3   9/2014
JP         2000256863 A   9/2000
(Continued)

OTHER PUBLICATIONS

Keunkyu Song et al., "Solution processed invisible all-oxide thin film transistors", Journal of Materials Chemistry, Jun. 26, 2009, pp. 8881-8886, vol. 19.
(Continued)

*Primary Examiner* — Moin Rahman
(74) *Attorney, Agent, or Firm* — Hauptman Ham, LLP

(57) ABSTRACT

Disclosed are a method for producing an oxide film using a low temperature process, an oxide film and an electronic device. The method for producing an oxide film according to an embodiment of the present invention includes the steps of coating a substrate with an oxide solution, and irradiating the oxide solution coat with ultraviolet rays under an inert gas atmosphere.

17 Claims, 17 Drawing Sheets

(51) Int. Cl.
    *H01L 29/24*     (2006.01)
    *H01L 29/786*     (2006.01)

(52) U.S. Cl.
    CPC ........ *H01L 21/02664* (2013.01); *H01L 21/26* (2013.01); *H01L 29/24* (2013.01); *H01L 29/7869* (2013.01)

(58) Field of Classification Search
    USPC ....... 257/43, 104, 74; 438/27, 85, 64, 57, 48
    See application file for complete search history.

(56) References Cited

U.S. PATENT DOCUMENTS

| | | | |
|---|---|---|---|
| 7,208,401 B2 | 4/2007 | Nelson et al. | |
| 2003/0096928 A1* | 5/2003 | Chawla | C08J 7/047 526/240 |
| 2004/0061109 A1 | 4/2004 | Nakamura et al. | |
| 2006/0292777 A1 | 12/2006 | Dunbar | |
| 2007/0003877 A1 | 1/2007 | Punsalan et al. | |
| 2008/0057631 A1 | 3/2008 | Cheng et al. | |
| 2008/0280161 A1* | 11/2008 | Jang | C09K 11/02 428/690 |
| 2008/0296567 A1* | 12/2008 | Irving | H01L 21/02554 257/43 |
| 2008/0311414 A1* | 12/2008 | Tanaka | C03C 17/002 428/469 |
| 2010/0230643 A1* | 9/2010 | Nakajima | C23C 18/06 252/512 |
| 2010/0247839 A1* | 9/2010 | Hayashida | G03F 7/001 428/64.4 |
| 2010/0258833 A1* | 10/2010 | Okumoto | H01L 51/5218 257/98 |
| 2010/0261304 A1 | 10/2010 | Chang et al. | |
| 2011/0253997 A1* | 10/2011 | Park | C23C 14/08 257/43 |

FOREIGN PATENT DOCUMENTS

| | | |
|---|---|---|
| JP | 2002231326 A | 8/2002 |
| JP | 2005272189 A | 10/2005 |
| JP | 2006096577 A | 4/2006 |
| WO | 2011/125036 A1 | 10/2011 |

OTHER PUBLICATIONS

K.K.Banger et al., "Low-temperature, high-performance solution-processed metal oxide thin-film transistors formed by a 'sol-gel on chip' process", Nature Materials, Dec. 12, 2010, pp. 45-50, vol. 10.
International Search Report for PCT/KR2012/010275 dated Feb. 15, 2013.
Japanese Office Action for application No. 2015-506879 dated Dec. 8, 2015.
European Search Report for application No. 12874836.5 dated Aug. 4, 2015.

* cited by examiner

FIG. 11

| MOBILITY (cm²/V·s) | IGZO | | IZO | | In₂O₃ | |
|---|---|---|---|---|---|---|
| | Thermal | UV | Thermal | UV | Thermal | UV |
| MAX | 6.56 | 10.32 | 4.48 | 5.24 | 12.92 | 13.86 |
| MIN | 5.10 | 6.91 | 2.44 | 2.81 | 6.49 | 8.43 |
| AVG | 6.01 | 8.76 | 3.72 | 4.43 | 10.31 | 11.29 |
| VAR | 0.754 | 0.98 | 0.63 | 0.59 | 1.55 | 1.82 |

| THRESHOLD VOLTAGE (V) | IGZO | | IZO | | In₂O₃ | |
|---|---|---|---|---|---|---|
| | Thermal | UV | Thermal | UV | Thermal | UV |
| MAX | 0.68 | 2.23 | 1.13 | 3.84 | -0.06 | 1.78 |
| MIN | 0.03 | 1.10 | -1.47 | 3.21 | -2.73 | 0.48 |
| AVG | 0.30 | 1.88 | 0.24 | 3.52 | -1.50 | 1.16 |
| VAR | 0.20 | 0.26 | 0.62 | 0.18 | 0.75 | 0.35 |

| SS (V/decade⁻¹) | IGZO | | IZO | | In₂O₃ | |
|---|---|---|---|---|---|---|
| | Thermal | UV | Thermal | UV | Thermal | UV |
| MAX | 0.103 | 0.208 | 0.622 | 0.136 | 0.600 | 0.310 |
| MIN | 0.257 | 0.121 | 0.096 | 0.056 | 0.361 | 0.148 |
| AVG | 0.158 | 0.169 | 0.238 | 0.104 | 0.459 | 0.235 |
| VAR | 0.040 | 0.028 | 0.158 | 0.019 | 0.068 | 0.042 |

FIG. 13

| CHANNEL | ANNEALING METHOD | ANNEALING TIME (min) | AVG MOBILITY (cm²/V·s) |
|---|---|---|---|
| IGZO | UV IRRADIATION | 30 | 0.7 |
|  |  | 60 | 1.9 |
|  |  | 90 | 1.6 |
|  |  | 120 | 2.3 |
| IZO | UV IRRADIATION | 30 | 0.1 |
|  |  | 60 | 0.1 |
|  |  | 90 | 1.2 |
|  |  | 120 | 0.4 |
| In₂O₃ | UV IRRADIATION | 30 | 1.9 |
|  |  | 60 | 2.8 |
|  |  | 90 | 3.5 |
|  |  | 120 | 3.6 |
| ZTO | THERMAL(@500°C) | 10 | 4.5 |
|  | UV IRRADIATION | 90 | inactive |
| IZTO | THERMAL(@500°C) | 10 | 1.5 |
|  | UV IRRADIATION | 90 | inactive |

METHOD FOR PRODUCING AN OXIDE FILM USING A LOW TEMPERATURE PROCESS, AN OXIDE FILM AND AN ELECTRONIC DEVICE THEREOF

TECHNICAL FIELD

The invention relates to a method for forming an oxide thin film using low-temperature process, more specifically to a method for forming an oxide thin film using the low-temperature process, and the oxide thin film and electric component thereof.

BACKGROUND OF THE INVENTION

In the various technology fields such as a display field, a solar cell field, a touch panel field etc., an oxide thin film has been used as the electric component of device. The main advantage of the oxide thin film is known that it can provide thin film with high electric conductance as well as high transparence.

As a material of this oxide thin film, Zinc oxide (ZnO), Indium zinc oxide (IZO), and Indium gallium zinc oxide (IGZO) and so on have been researched. Recently, Zn (Zinc), Sn (Tin), Ti (Titanium) has been investigated as an alternative material of Indium in order to improve the economic efficiency of the device manufacturing.

In the meantime, vacuum deposition equipment including a target etc. has been a dominant process in oxide thin film deposition. But recently the researches about the oxide thin film forming method using the solution process have been conducted for the low cost process.

But the method using the solution process has several weak points. For example, it requires a thermal process at the high temperature more than 300° C. during the manufacturing process. The reasons are listed below. Firstly, the high temperature treatment is needed for removing organic solution in the oxide solution. Secondly, it is for generating oxidizing substances inducing reaction between the metallic material and oxygen and has the specific functional (the conductor, the semiconductor, the insulator property etc.). Thirdly, it is to remove the impurities which deteriorate the film quality with the combination of the oxidizing substances.

Regarding the thermal treatment during the solution process, the thermal treatment at the high temperature increases the manufacturing cost of the oxide thin film. Moreover, thermal process at the high temperature may cause the deformation of the substrate, especially, in case of plastic substrate, textile material and so on, whose melting points are relatively low. It is crucial factor for application of flexible electronic device.

To solve the problem, the research about annealing the oxide film at low temperature has been performed. One example of these researches is that the oxide film is annealed at the vacuum environment at lower thermal annealing temperature. But in case of vacuum process, there are several disadvantages such as the non-uniformity, performance degradation, as well as a rise of manufacturing cost. Moreover, the temperature also has the lower limit of about 230° C. level. Even if the lower temperature is possible, the impurities cannot be fully removed, which makes the performance of the oxide thin film easily degraded.

In order to solve these problems, when the oxide thin film is formed using solution process, the annealing process using the laser has been suggested. U.S. Pat. No. 7,208,401A and US2008/0057631 etc. are the examples. The prior arts disclose the technology which irradiates the oxide solution layer with the laser light at the atmosphere. But, the prior art couldn't achieve an oxide thin film with a good performance. In other words, there has been no research with a good performance about irradiating the oxide solution layer with the laser light. We also tried to manufacture the oxide thin film according to prior arts. But, we weren't able to achieve the quality applicable to electronic device.

PRIOR ART

Patent Documents (Patent document 001) US Patent Publication 2010-0261304 (2010 Oct. 14 published)

Non-Patent Documents (Non-patent Document 0001) K K Banger et, al., "Low-temperature, high-performance solution-processed metal oxide thin-film transistors formed by a 'sol-gel on chip' process", *Nature* Materials, Volume 10, Page 45-50, 2011.

DETAIL DESCRIPTION OF INVENTION

Technical Problem

To solve the above mentioned problem, the demand about the technology of manufacturing the oxide thin film still exists with heat treatment at low temperature.

Solution to Solve the Problem

One aspect of the present invention provides a method for forming an oxide thin film using low-temperature process, comprising: coating an oxide solution on a substrate; and irradiating the coated oxide solution with ultra-violet light in an inert gas atmosphere.

"Oxide thin film" is not limited and can be utilized as a semiconductor layer, a transparent conductive film, and an insulating layer. Preferably, it is the semiconductor layer of the electric component used.

The oxide material may be Indium oxide ($In_2O_3$), Zinc oxide (ZnO), Indium zinc oxide (IZO), Indium gallium zinc oxide (IGZO), Zinc tin oxide (ZTO), Titanium Oxide ($TiO_2$), Indium tin oxide (ITO), Aluminum oxide ($Al_2O_3$), Silicon oxide ($SiO_2$), the Silicon oxide ($SiO_2$) etc. Additionally, various kinds of metals may be contained in the oxide material and all kinds of metal oxide are included in the scope of the present invention.

It is possible that an indium precursor, gallium precursor, zinc precursor, tin precursor, an aluminum precursor and so on are usable in forming the oxide thin film by the solution process. At least one these precursors may be combined and used for the solution process.

The examples of precursor are follows. The Zinc precursor includes zinc chloride, Zinc acetate, Zinc acetate hydrate, Zinc nitrate, Zinc nitrate hydrate, Zinc alkoxide or their derivative. The Gallium precursor includes Gallium nitrate, Gallium nitrate hydrate, Gallium acetate, Gallium acetate hydrate, Gallium alkoxides, or their derivative. The Indium precursor includes indium chloride, indium acetate, indium acetate hydrate, indium nitrate, indium alkoxide. Tin precursor is one selected from the group consisting of Tin chloride, Tin acetate, Tin nitrate, Tin alkoxides, their derivative, and their mixture. It is possible that the other metal precursor including the aluminum precursor etc. may be usable as a precursor of the invention.

"Inert gas atmosphere" means the nitrogen atmosphere, the argon atmosphere, the helium atmosphere etc. "Inert gas atmosphere" excludes the environment in which intentional oxygen air is inputting. Preferably, the vacuum process is not necessary and the inactive gas is inflowed into the standby state in which the coated oxide solution is irradiated with ultraviolet light.

The step of irradiation comprises the first step of forming at least partial network of metal-oxide-metal bond inside the oxide solution; and the second step of removing the impurity of the oxide. Preferably, the duration time of ultraviolet irradiation is 1 to 240 minutes. The step of forming at least partial network of metal-oxide-metal bond is preferably during 30 minutes after the ultraviolet lights are irradiated. This can be changed according to the intensity of the ultraviolet ray, the ultraviolet wavelength etc. Preferably, the network more than 50% is formed. It can be confirmed with the rapid change of the content of the reduction of the rapid oxygen and carbon. Therefore, the end of the first step is till the point of time when the sudden reduction of oxygen is terminated. The period of the second step may be preferably 30 minutes to 120 minutes, more preferably 90 minutes to 120 minutes. In experimental example 2 which will be described later, it could confirm that the property was excellent in case the ultraviolet ray was irradiated for 90 minutes to 120 minutes.

Preferably, the wavelength of the ultraviolet ray may be 150 nm to 260 nm. The absorption rate of the solution of the precursors of the metal In, Ga, Zn can be most effective in 150 nm to about 260 nm, even if the absorption rate is different depending on the kind of the solvent. More preferably, at least some portion of the ultraviolet ray of 160 nm to 190 nm is included in ultraviolet lights.

Preferably, the oxide solution includes metal precursor solution, the metal precursor solution is 2-Methoxyethanol (2-ME) or DE-ionized water (Deionized water). The DE-ionized water is very effective in improving the abortion of ultraviolet lights.

Before or at the same time of the ultraviolet irradiation, the step of varying the temperature of the substrate is performed. Optionally, before of the ultraviolet irradiation, the coated solution on the substrate is heat-treated and stabilized. The heat treating is for film uniformity and thickness uniformity. The irradiation may be conducted at the room temperature to 200° C. with 1 through for 60 minutes.

Moreover, the speed of the oxide thin film formation can be increased by adding the thermal energy to the substrate in addition to the ultraviolet irradiation. The process may be performed for 1 through for 60 minutes at the room temperature to 200° C.

It is another aspect of the present invention to provide the oxide thin film manufactured by the oxide thin film producing method.

It is another aspect of the present invention to provide the electric device including the oxide thin film manufactured by the oxide thin film producing method.

The oxide thin film is usable for the thin film transistor at the display field, the semiconductor, and the electric component at the solar cell field or the touch panel field. It is applicable in the semiconductor layer of the electric component, the insulating layer and transparent electrode etc. More preferably, it is used as the channel layer of the thin film transistor. The various types of thin film transistor is possible if the invention can be applied to. For example, it is possible that the gate electrode is formed at the lower part of the channel layer or on upper part of the channel layer.

Effects of the Invention

According to the present invention, the coated oxide solution can be stabilized with heat-treated. It can accomplish uniformity of the oxide thin film.

Moreover, the ultraviolet ray is irradiated under the inert gas atmosphere, which induces the oxide formation. In that way the degradation of the oxide property can be prevented.

Moreover, the equipment of the high cost is not required. Therefore, the high quality oxide thin film can be manufactured with economic efficiency.

BRIEF EXPLANATION OF THE DRAWING

FIG. 11 is a graph showing a mobility, a threshold voltage (Vt), and a swing (sub-threshold swing, SS) of the respective heat-treated and the UV-irradiated thin film transistors with IGZO, IZO, and the $In_2O_3$.

FIG. 13 shows the average mobility characteristic according to the irradiation time of ultraviolet light in the IGZO, IZO, the $In_2O_3$, the ZTO IZTO etc as the channel layer of the thin film transistor.

DETAILED DESCRIPTION OF THE EMBODIMENTS

Hereafter, the embodiments of the present invention will be described in detail with reference to the accompanying drawings. However, the embodiments of the present invention as illustrated below may be modified in various different forms, and the scope of the present invention is not intended to limit the embodiments as set forth above. It should be noted that the embodiments are provided to make a full disclosure and also to allow those skilled in the art to know the full scope of the present invention.

Figure 1:
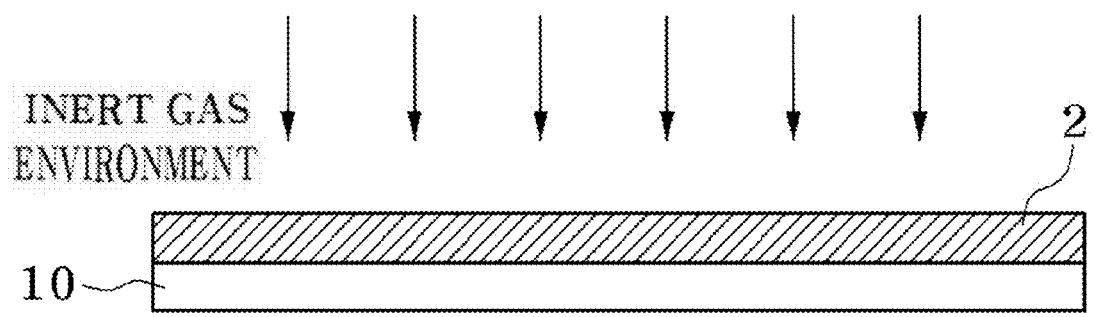
FIG. 1 is a drawing illustrating the oxide thin film producing method according to a preferred embodiment of the present invention.

FIG. 1 is a drawing illustrating the oxide thin film producing method according to a preferred embodiment of the present invention. Referring to FIG. 1, the oxide solution 2 is coated on the substrate 10. The oxide solution is irradiated under the inert gas atmosphere.

Firstly, the oxide solution is coated through the solution process on the substrate. The coating may be a spin coating, a dip-coating, an inkjet printing, an offset printing, reverse offset printing, gravure printing or the roll printing. But, solution process is not limited to above mentioned solution process.

The substrate is not restricted to the specific kind. The substrate may be a semiconductor substrate, a glass substrate, a paper, a polymer substrate such as plastic etc. Since the ultraviolet irradiation according to the invention can be performed at low-temperature, the substrate such as plastic which is appropriate to low temperature process is preferable.

The examples of precursor are follows. The Zinc precursor includes zinc chloride, Zinc acetate, Zinc acetate hydrate, Zinc nitrate, Zinc nitrate hydrate, Zinc alkoxide or their derivative. The Gallium precursor includes Gallium nitrate, Gallium nitrate hydrate, Gallium acetate, Gallium acetate hydrate, Gallium alkoxides, or their derivative. The Indium precursor includes indium chloride, indium acetate, indium acetate hydrate, indium nitrate, indium alkoxide. Tin precursor is one selected from the group consisting of Tin chloride, Tin acetate, Tin nitrate, Tin alkoxides, their derivative, and their mixture. It is possible that the other metal precursor including the aluminum precursor etc. may be usable as a precursor of the invention.

The oxide solution includes metal precursor solution, the metal precursor solution is 2-methoxyethanol or DE-ionized water.

Moreover, a mono-ethanolamine, and the acetic acid or the acetyl acetone can be used as the additive but it is not thus restricted.

The thickness of the coated oxide solution is not restricted. And the oxide solution can be coated in, for example, 5 through 300 nm thickness.

One characteristic of the present invention may be the process of irradiating the ultraviolet ray in the coated oxide solution under the inert atmosphere. By performing the oxide thin film under this condition, the oxide thin film using the laser become to be applicable oxide thin film. As described above, there has been several attempts in which the irradiation process was performed under oxygen-existed environment.

The inventors discovered that there is a problem that the ozone ($O_3$) is generated from irradiating the ultraviolet ray to the oxide solution in which oxygen exists. It can deteriorate the performance of the electronic device. According to a preferred embodiment of the present invention, the ultraviolet ray is irradiated under the inert gas atmosphere. In that way characteristic of the oxide cannot be deteriorated. In the meantime, the vacuum process is not necessary. Generally, the vacuum process is high cost process. The invention shows the ultraviolet irradiation under inert gas environment (in air condition, without vacuum process) can be effectively applicable to mass production in manufacturing the devices.

Moreover, the ultraviolet irradiation is executable through the ultraviolet ray source like the high-pressure mercury lamp. However it is not thus restricted.

Next, the inventors explain the scenery manufacturing the excellent thin film through the ultraviolet irradiation in the oxide thin film in detail.

Figure 2:
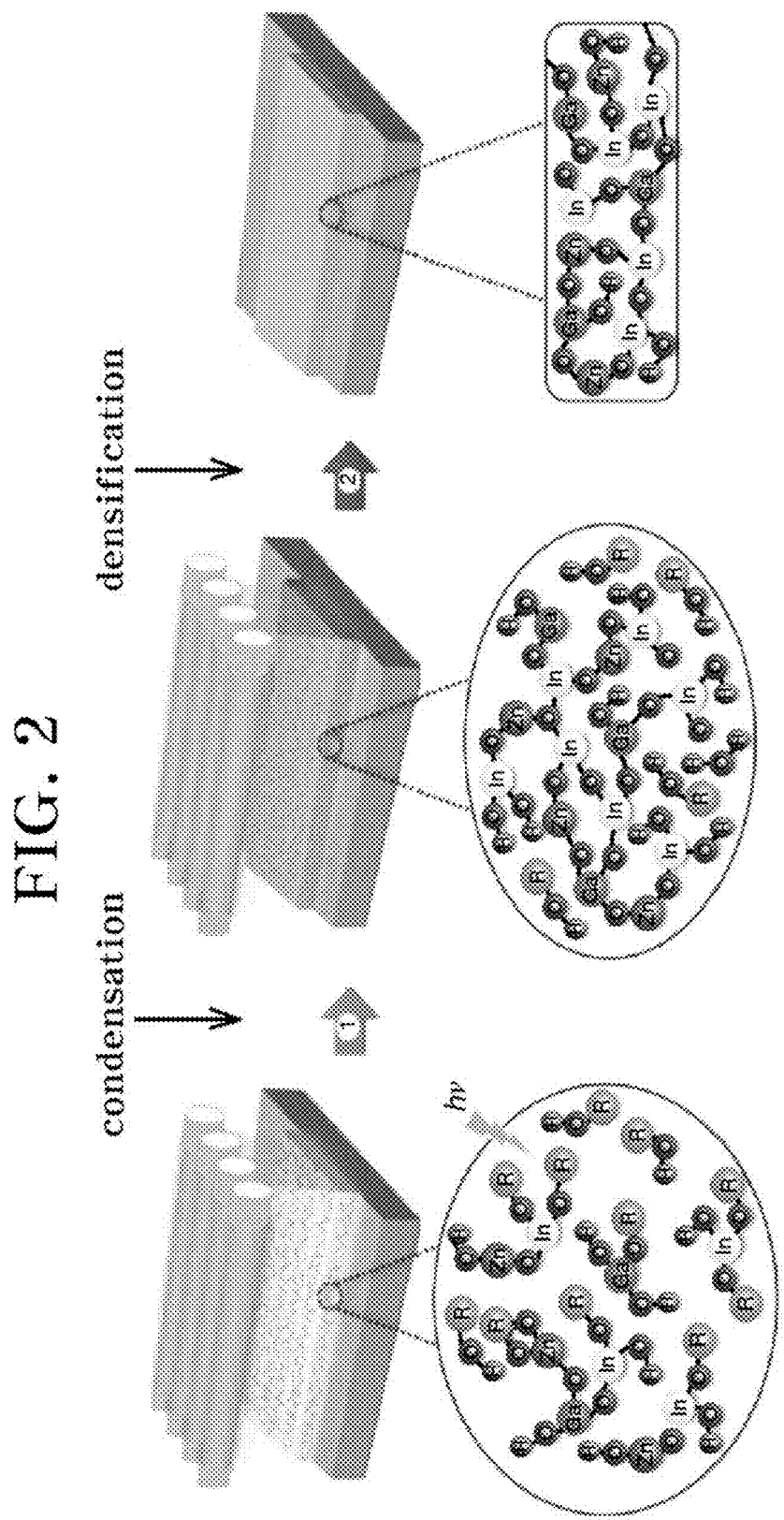
FIG. 2 is a drawing showing the process forming the IGZO thin film by the ultraviolet irradiation according to the embodiment of the invention.

FIG. 2 is a drawing showing the process forming the IGZO thin film by the ultraviolet irradiation according to the embodiment of the invention.

The inventors discovered that the ultraviolet irradiation on the oxide thin film for a certain time period has an impact on the performance of the oxide film through 2-step phase change. The first phase is a condensation and the second phase is a densification.

In the condensation phase, the Metal-Oxygen-Metal (M-O-M) bonds make network. Before of the irradiation, the spin-coated oxide film (for example, 25-35 nm) has organic components. Thereafter, the spin-coated oxide thin film is irradiated by the ultraviolet ray in the mood in which nitrogen is fuzzed. At this time, the active metal and oxygen atoms form the M-O-M network (condensation phase). It was discovered that the cleavage and condensation by this ultraviolet ray were generated for first about 30 minutes after the ultraviolet irradiation Since the additional investigation removes the residue of carbon and oxygen it proceeds to the densification phase. In the second phase it removes the impurity of the formed oxide. The oxide formed in this process contains impurities of the carbon (C), hydrogen (H), nitrogen (N), chlorine (Cl), etc.

These impurities may influence the quality of thin film. According to the oxide thin film producing method according to a preferred embodiment of the present invention. The duration of the ultraviolet irradiation remains constant in order to remove impurities. At this time, the holding time of the ultraviolet irradiation is preferably may be 1 to 240 minutes. If the ultraviolet irradiation period is so short, the thin film doesn't have enough times of experiencing 2 phases, which is not able to make the film of the excellent characteristic. In case the irradiation time of ultraviolet ray exceeds 240 minutes, it may cause the denaturation of the oxide or the deformation of the substrate. In the case of using the oxide thin film as the channel layer of the thin film transistor, the device shows excellent characteristic in the range of the ultraviolet irradiation of 90 minutes to 120 minutes.

Moreover, while the ultraviolet irradiation is conducted, the temperature of the substrate can maintain at the room temperature through 200° C.

Optionally, before of the ultraviolet irradiation, the oxide solution coated on the substrate with may be heat-treated and stabilized. It is for the quality improvement and uniform thickness of the coated oxide solution. The temperature of the heat treatment is room temperature to 200° C. and the time period is 1 through 60 minutes.

In the meantime, the irradiated ultraviolet ray has the wavelength of the ultraviolet range and/or the deep ultraviolet region. Preferably, the wavelength of the ultraviolet is 150 nm through 260 nm. In case the wavelength is shorter than that of 150 nm, it has a problem that the oxide is destroyed by the ultraviolet light. In case the wavelength is longer than 260 nm the ultraviolet can't supply for energy enough for the oxide formation.

Figure 3:
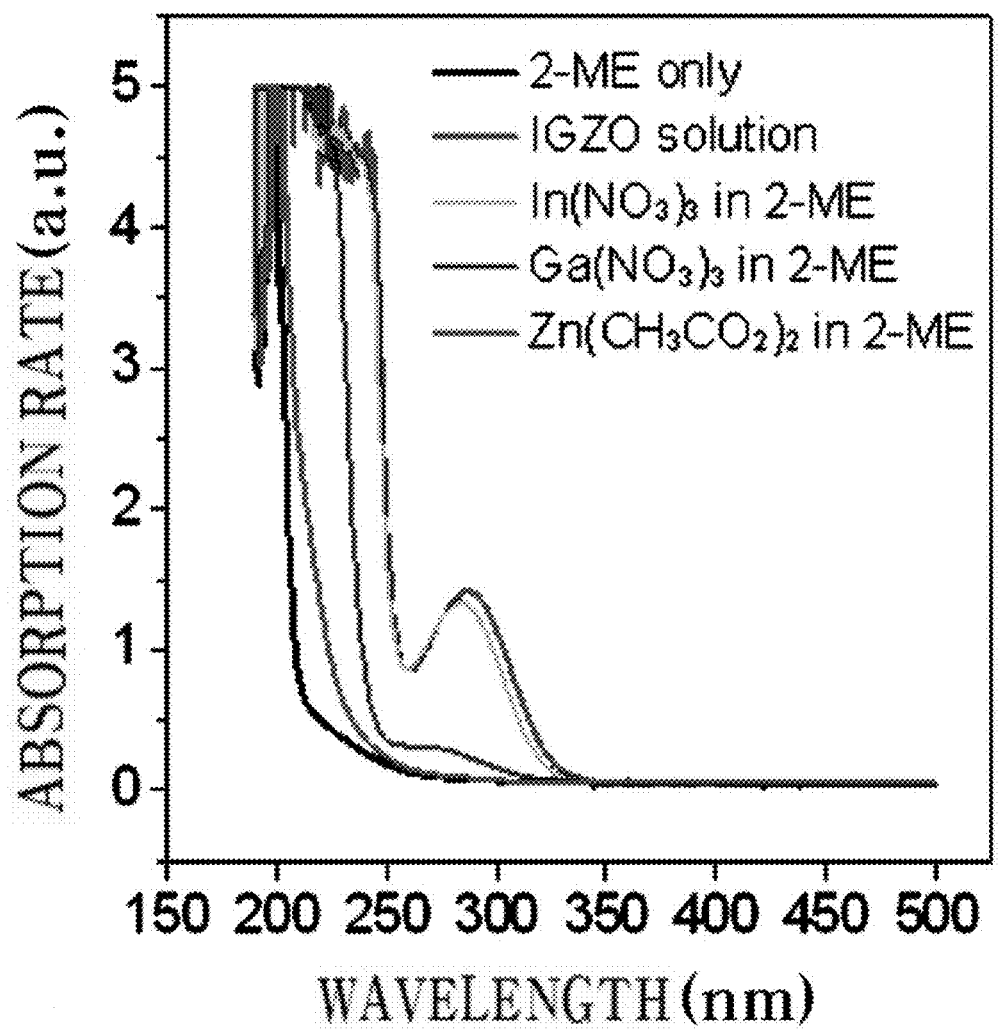
FIGS. 3 and 4 are graphs showing each wavelength absorption spectrum of the metal precursor solution for the oxide thin films.
Figure 4:
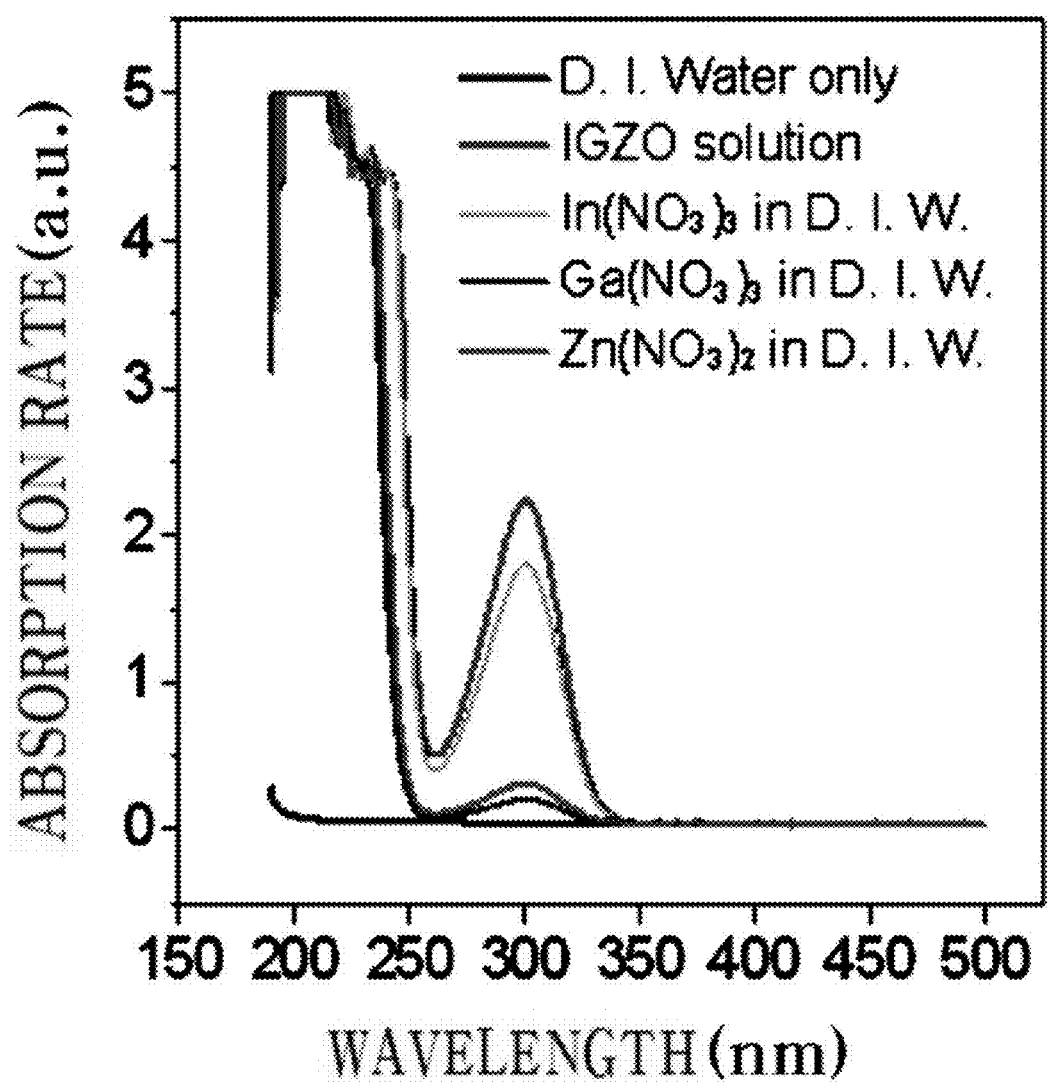

FIGS. 3 and 4 are graphs showing each wavelength absorption spectrum of the metal precursor solution for the oxide thin films. FIG. 3 shows the results of IGZO solution and each wavelength absorption rate of the solution of the precursors of 2-Methoxyethanol and individual metal In, Ga, Zn together, which is given for the comparison with the IGZO solution. The $In(NO_3)_3.xH_2O$, $Ga(NO_3)_3.xH_2O$ and $Zn(CH_3CO_2)_2.2H_2O$ in solution of 2-Methoxyethanol represent the respective strong absorption rates, 260, 250, and 230 nm, respectively. This behavior is different from 2-Methoxyethanol showing the least absorption in the wavelength of 225 nm through 350 nm. Since the mercury UV lamp used in this experiment has two peaks at 253.7 nm and 184.9 nm, its irradiation can be effective in optical chemical activation of indium, gallium, and zinc molecules.

FIG. 4 shows each wavelength absorption rate of the solution of the precursors of DE-ionized water and individual metal In, Ga, Zn together for the comparison with IGZO solution. In case of the solution which contains DE-ionized water, the ultraviolet light absorption rate of the Zinc solution drastically increases as shown.

Referring to FIGS. 3 and 4, even though there are differences according to the kind of the solvent, absorption rates of the solution of the precursors of the metals In, Ga, Zn are excellent in wavelength of 150 nm to about 260 nm. Compared with FIG. 3, FIG. 4 can confirm the phenomenon that the absorption wavelength band of the precursors of the metal In, Ga, Zn has wider wavelength range. Therefore, the ultraviolet absorption rate in D. I. water is expected to be higher than 2-Methoxyethanol.

The oxide thin film is usable for the thin film transistor of the display technology field, various kinds of the semiconductor device, and the electric component at the solar cell field or the touch panel field. It is applicable as the semiconductor layer of the electric component, the insulating layer and transparent electrode etc. But hereinafter, the case in which the oxide thin film is used as the channel layer of the thin film transistor is mainly illustrated.

Figure 5:
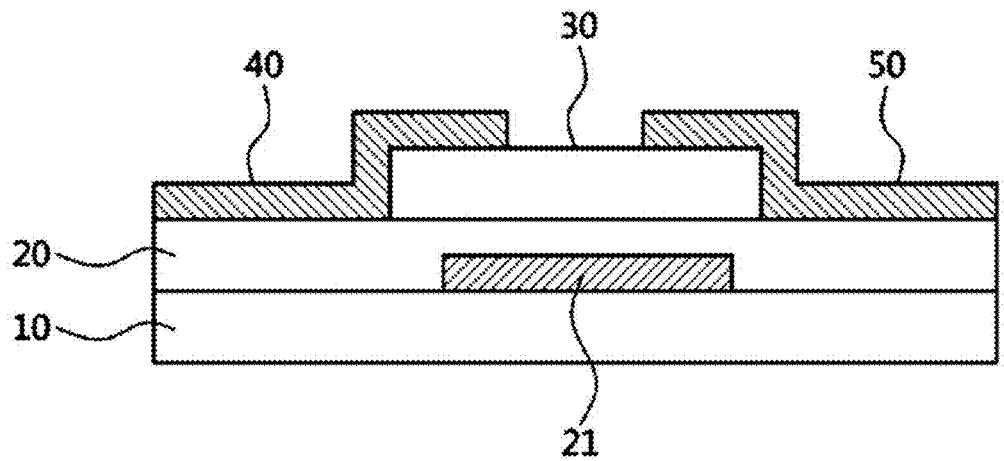
FIG. 5 is a schematic diagram of the oxide thin film transistor using the oxide thin film as the channel layer according to a preferred embodiment of the present invention.

FIG. 5 is a schematic diagram of the oxide thin film transistor using the oxide thin film as the channel layer according to a preferred embodiment of the present invention.

Referring to FIG. 5, the oxide thin film transistor has a gate insulating layer 20 and a gate electrode 21 on a substrate 10. On the gate insulating layer 20, an oxide channel layer 30, a drain electrode 40, and source electrode 50 are formed. At this time, in the process of forming oxide channel layer 30, the oxide thin film producing method according to a preferred embodiment of the present invention can be applied to. The detailed explanation about the gate insulating layer 20, the gate electrode 21, and the drain electrode 40 and source electrode 50 are omitted because it is similar as the publicly known in thin film transistor.

The oxide solution is coated on the gate insulating layer 20 through the solution process. After the oxide solution is heat treated and stabilized, the ultraviolet light is irradiated in the inert gas atmosphere, which induces the oxide formation. By maintaining the ultraviolet irradiation time for certain period the impurities of the oxide can be removed and high quality channel layer 30 can be formed. It suggests that the high quality thin film transistor is able to be manufactured with economic efficiency. Moreover, the equipments of the high costs are not required.

Experimental Example 1

Figure 6:
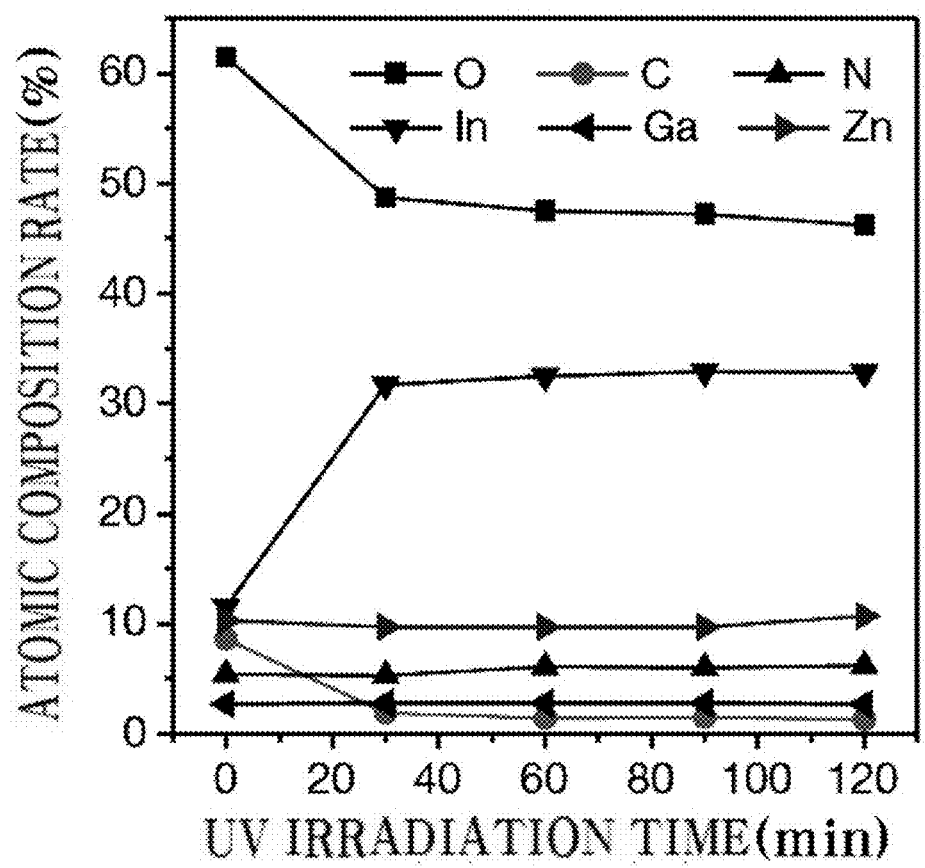
FIG. 6 shows atomic composition ratios of IGZO thin films as a function of DUV irradiation time.

The metal precursors for the IGZO thin film were dissolved in 2-methoxyethanol. The resultant precursor solution was stirred at 75° C., for more than 12 hours, a ligand exchange reaction occurs from nitrate/acetate to 2-Methoxyethanol or hydroxide, and condensation of the metal alkoxides/hydroxides proceeds to form a partial network of metal-oxide-metal (M-O-M) in the solution. FIG. 6 shows atomic composition ratios of IGZO thin films as a function of DUV irradiation time. According to FIG. 6, the as-spun film (25-35 nm) before DUV irradiation still contain a significant amount of residual organic components, as confirmed by a high carbon content in the film.

Subsequently, the spin-coated oxide thin film is irradiated by DUV lamp (it has the peak in 184.9 nm (10%) and 253.7 nm (90%)) in the mood in which nitrogen is fuzzed. During the irradiation, the distance between the sample and the DUV lamp is remained by 1~5 cm gap. $N_2$ gas is continually injected. The output energy of this lamp was about 25~28 $mWcm^{-2}$. In case of 90 minutes irradiation, the doses was measured at 135-151 $Jcm^{-2}$, In case of 120 minutes irradiation, the doses was measured at 180-201 $Jcm^{-2}$. The active metal and oxygen atoms form the M-O-M network with the UV investigation (condensation, and ① step). The cleavage and condensation by this ultraviolet ray is confirmed by the reduction of the rapid oxygen and content of carbon (refer to FIG. 6). The cleavage and condensation by the ultraviolet ray is generated for about first 30 minute after the ultraviolet irradiation. In this process, the network of 50%~90% is partly formed. For example, the 24% network before the first irradiation was changed into 71% network after the first irradiation.

Next, the additional irradiation removes the residues of carbon and oxygen and transfers to the densification process (the densification, and ② step).

But in case of the oxide thin film used as semiconductor layer of the thin film transistor, the excellent characteristic was shown in the dose irradiation of 135-201 $Jcm^{-2}$ for 90 minutes to 120 minutes at the nitrogen atmosphere, Referring to FIG. 6, there is almost no change in the atomic weight after 60 minutes and, after 90 minutes, the device characteristics such as the electron mobility and uniformity was discovered to be very excellent.

Comparative Example 1

In the meantime, the experiment was performed for comparing the oxide thin film manufactured in the experimental example 1 with a thermally annealed thin film.

Figure 7:
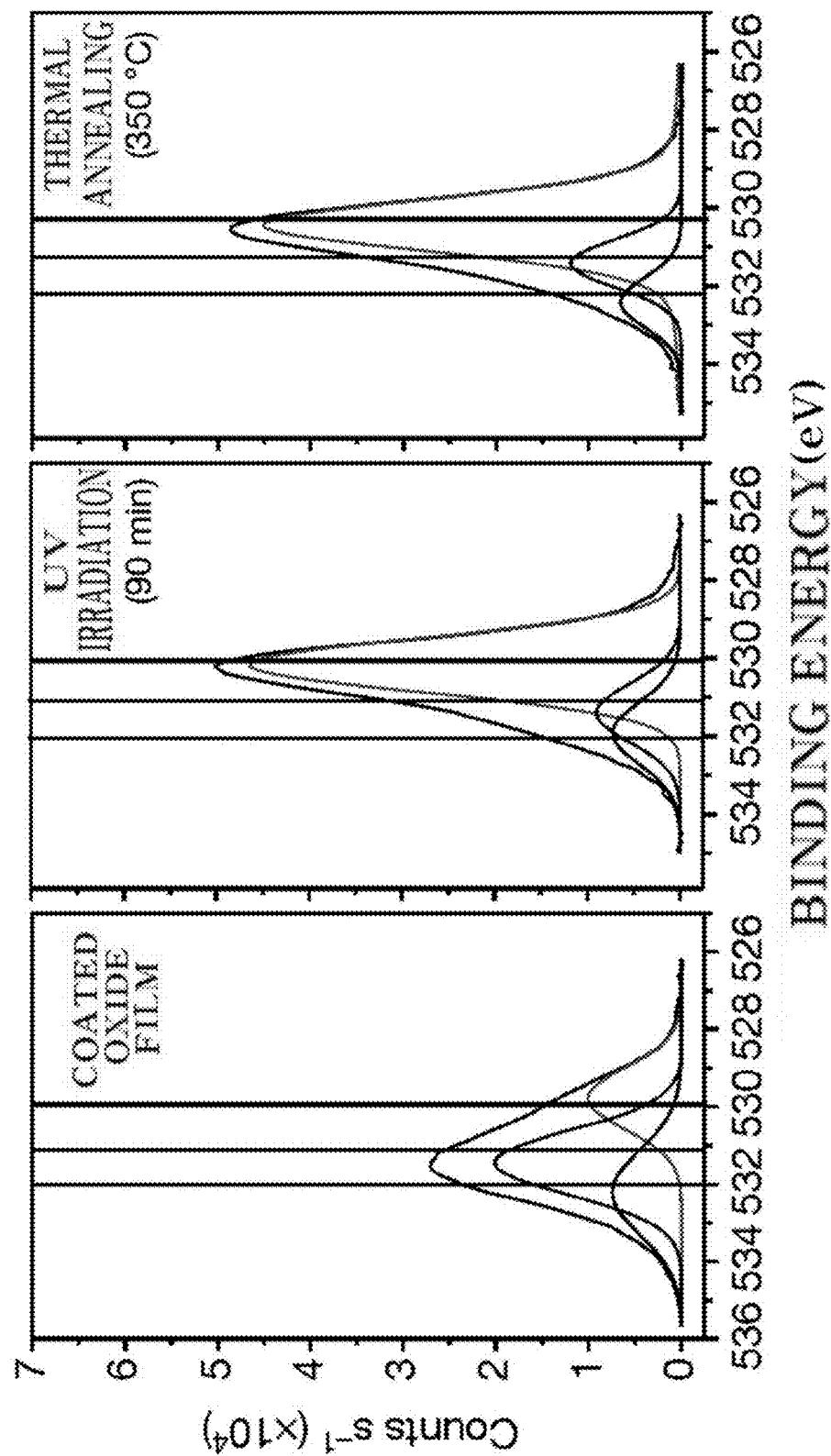
FIGS. 7 and 8 are graphs for comparing the coated oxide film, a thin film irradiated with UV rays, a thin film annealed at 350° C.
Figure 8:
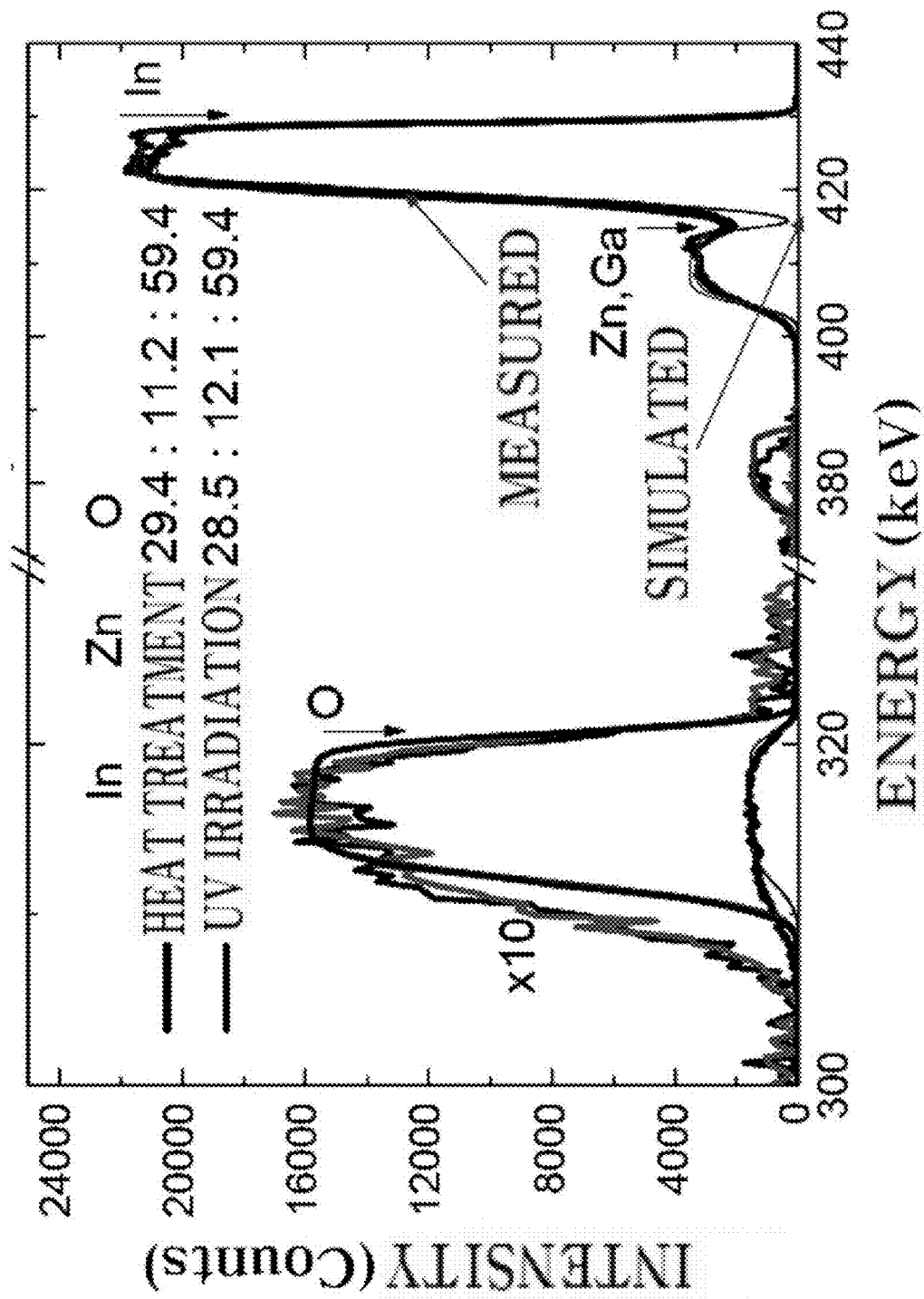

FIGS. 7 and 8 are graphs for comparing the coated oxide film, a thin film irradiated with UV rays, a thin film annealed at 350° C.

Specifically, the IGZO thin film (P) by the UV irradiation of the experimental example 1 and the IGZO thin film (T) which the thermally was annealed (60 minutes in 350° C.) were compared. FIG. 7 shows their respective X-ray photoelectron spectrum (O(1 s) peak). As shown in FIG. 7, the thermally annealed thin film and the UV-irradiated thin film exhibit the similar deconvolution peak. This means that M-O bonding states of the IGZO thin film (P) are similar those of the IGZO thin film (T).

FIG. 8 shows the RBS (Rutherford Backscattering spectrometry) spectrum of the IGZO thin film (P) by the UV irradiation and the IGZO thin film (T) by thermally annealing (the Zn component comprises the Ga atom). The density was measured to be $52.88 \times 10^{15}$ atoms $cm^{-2}$(P), $52.43 \times 10^{15}$ atoms $cm^{-2}$(T). The thickness was measured at 7.1-9.70 nm (P) and 7.1-10.27 nm (T) by the HRTEM (High-resolution transmission electron microscopy) (lower limit) and oval measurement method (ellipsometry) (upper limit). Therefore, it shows that the characteristics of the IGZO thin film (T) and IGZO thin film (P) are nearly similar.

The inventors supposes that the densification phase after 60 minutes causes organic residues (the solvent molecules and residue alkoxy groups) are disassembled by the ultraviolet irradiation photolysis and the reorganization of the M-O-M network.

The inventors discovered that the ultraviolet irradiation causes the temperature of oxide thin film to be increased to about 150° C. It was not the original intention. The temperature was maintained even in case of continually irradiating over 120 minutes with 180-201 Jcm$^{-2}$. For the comparison, the oxide film was tested by annealing at 150° C. without the UV irradiation or cooling the oxide film at 40-70° C. after ultraviolet irradiation. But the necessary electrical characteristics could not be acquired from those oxide films at all.

Comparative Example 2

The silicon oxide film was formed with the thickness of 200 nm on the silicon wafer which is heavily p-doped. Next, the solution containing the metal precursors for the IGZO thin film was coated on the silicon oxide film through the spin coating. At this time, in the IGZO solution, 2-Methoxyethanol was used as the solvent. And 0.085M indium nitride hydrate, and 0.0125M Gallium nitrate hydrate and 0.0275M Zinc acetate dehydrate were used.

Next, the coated IGZO solution was irradiated using the UV lamp and the oxide formation was induced. The ultraviolet irradiation was performed under the oxygen environment in the comparative example, not under the nitrogen atmosphere (nitrogen is continuously supplied). The ultraviolet ray was irradiated using the UV lamp of the experimental example 1.

Thereafter, the formed IGZO oxide thin film was used as the channel layer. By forming IZO electrode layer at the upper part of the IGZO oxide thin film and patterning it, the source and drain electrode was manufactured.

Figure 9:
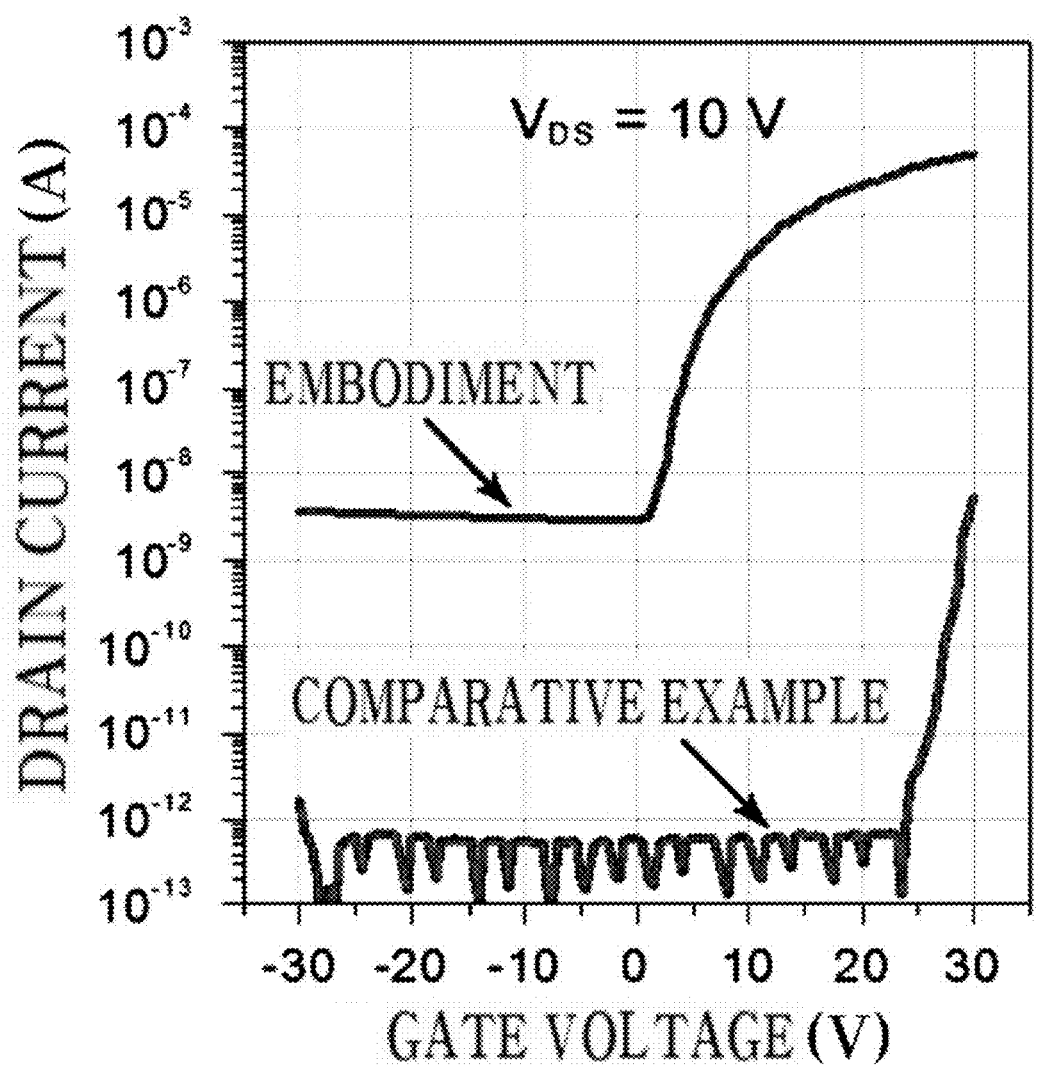
FIG. 9 is a graph showing characteristics of the oxide thin film with the ultraviolet irradiation at the nitrogen atmosphere and oxygen atmosphere.

FIG. 9 is a graph showing characteristics of the oxide thin film with the ultraviolet irradiation at the nitrogen atmosphere and oxygen atmosphere.

The current delivery characteristic was measured. The result was shown in FIG. 9. The current delivery characteristic was measured by measuring the drain current change under the change of the voltages from +30 V to −30V in the gate terminal.

FIG. 9 represents that the sample of the ultraviolet irradiation under the nitrogen atmosphere has improved characteristics than the comparative example in which the ultraviolet irradiation is made under the presence of oxygen. This kind of difference shows that the ultraviolet irradiation under the nitrogen atmosphere deteriorates the device less than the ultraviolet irradiation under the oxygen atmosphere.

The inventors determine that the light activation (the light activation is dramatically decreased at 184.9 nm) by the UV lamp drastically reduces with the absorption of the oxygen molecules. This phenomenon may be main factor of deterioration of the oxide thin film.

Therefore, the light activation by the UV lamp has the important meaning in the ultraviolet wavelength region of 160 nm to 190 nm. That is, the ultraviolet ray of 160 nm to 190 nm wavelength can secure the excellent oxide thin. The DUV lamp used in this experiment has the peak in 184.9 nm (10%) and 253.7 nm (90%).

The photo flux of the DUV lamp are 2.88~3.22×10$^{20}$/m$^2$sec (253.7 nm), 2.32~2.6×10$^{19}$/m$^2$sec (184.9 nm). The phenomenon that the UV photo activation is dramatically decreased in 184.9 nm is understood that the even if UV at 184.9 nm has relatively small power the light can function as preventing from producing ozone. The wavelength band was calculated as 160 nm to 190 nm.

Experimental Example 2

In the above, the IGZO film was explained but the other oxide thin film such as Zinc Tin Oxide (ZTO), Indium Zinx Oxide (IZO), Zinc Tin Oxide (ZTO), Indium Zinc Tin Oxide (IZTO)) etc can be applied. The inventors discovered that the oxide thin film of the solution process of the present invention was not limited specifical experimental case since the inventors actually made various oxide thin film transistors. Avoiding the use of the $ZnCl_2$ solution was confirmed. It is caused by the point that the $ZnCl_2$ solution hardly absorbs the ultraviolet light. IGZO, IZO, IZTO, $in_2O_3$ solutions are made by dissolving Indium nitrate hydrate (In $(NO_3)_3.xH_2O$), Gallium nitrate hydrate $(Ga(NO_3)_3.xH_2O)$ and Zinc Acetate $(Zn(CH_3CO_2)_2.2H_2O)$, Zinc chloride $(ZnCl_2)$, Tin $(Sn(CH_3CO_2))$, Tin cloride $(SnCl_2)$ in 2-Methoxyethanol. And in the precursor solution is stirred at 75° C., for more than 12 hours.

In the Table 1, the molarity of the metal precursors of the IGZO, IZO, IZTO, $in_2O_3$ solutions are shown.

But the ZTO solution is made as follows. The powders of Zinc chloride $(ZnCl_2)$ and Tin cloride $(SnCl_2)$ are dissolved in the acetonitrile by the molecular density 0.07M:0.07M of the Zn:Sn. It was stirred for 15 minutes at a room temperature after dissolving precursors in the solvent.

Figure 10:
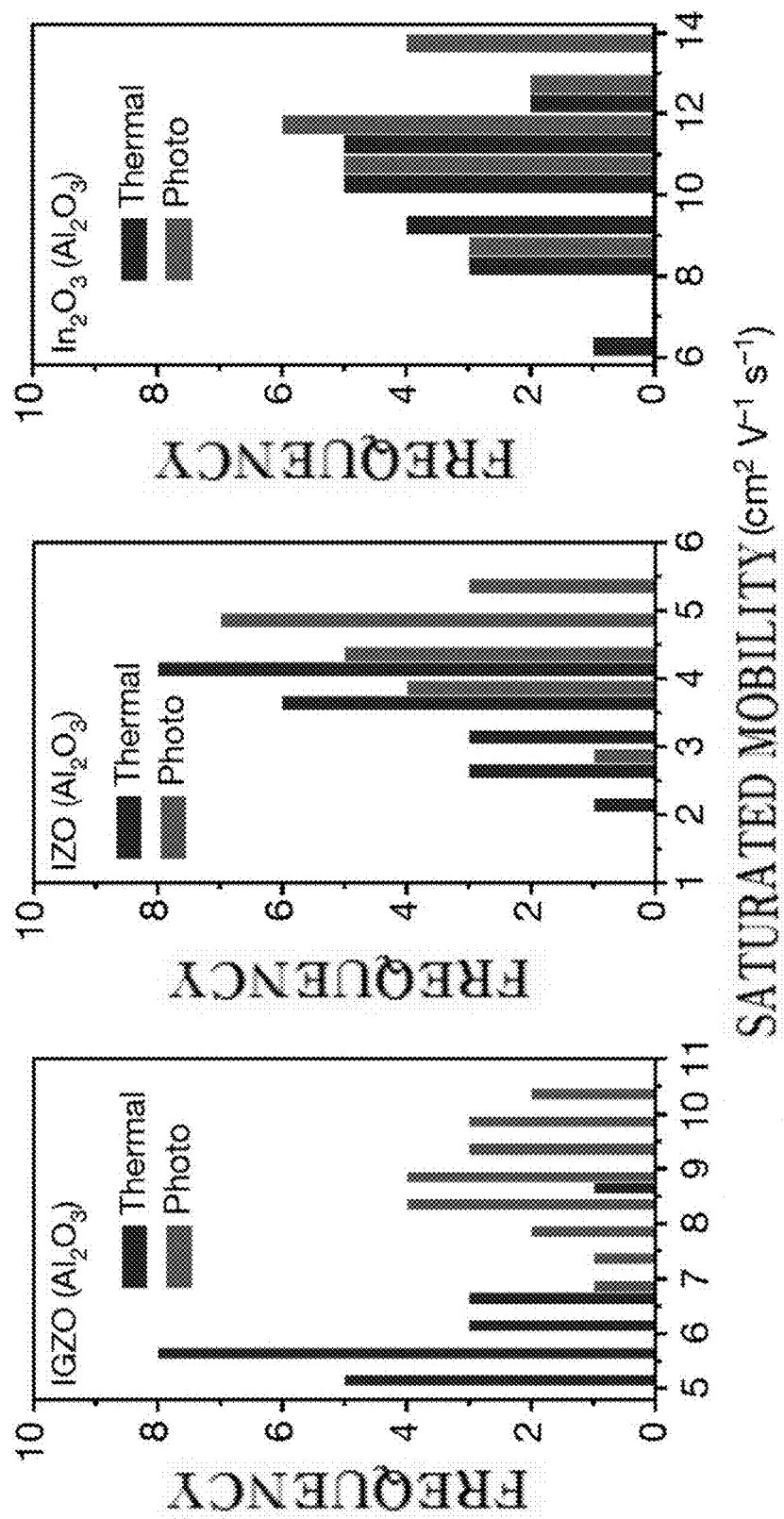
FIG. 10 is a graph showing characteristics of the heat-treated and UV-irradiated thin film transistors having IGZO, IZO, and $In_2O_3$ channel layer.

FIG. 10 is a graph showing characteristics of the heat-treated and UV-irradiated thin film transistors having IGZO, IZO, and $In_2O_3$ channel layer. Respective 20 thin film transistors were manufactured.

Specifically, $Al_2O_3$ gate insulating layer (35 nm) is formed on the glass substrate. On the gate insulating layer, the heat-treated and UV-irradiated oxide thin films were manufactured as channel layers.

In case of the heat-treated sample, IGZO, IZO, and the $In_2O_3$ channel layer were coated by spin coating. For 10 minutes the sample was baked in 200° C. It was annealed for 60 minutes 350° C. at the hot plate. The oxide thin film such as ZTO, IZTO etc. was baked at 200° C. for 10 minutes. It was annealed for 10 minutes at 500° C. in the hot plate.

Figure 12:
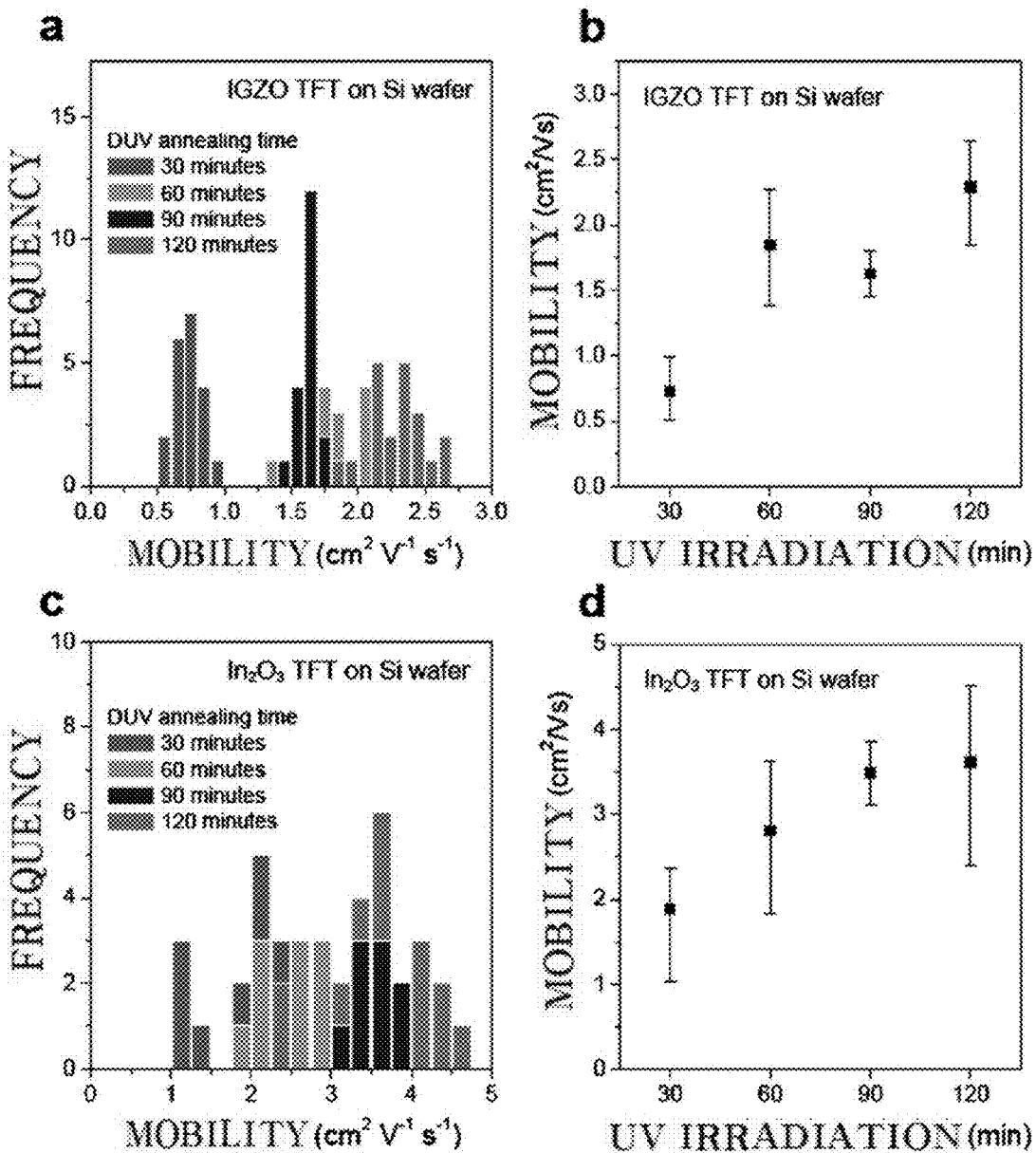
FIG. 12 is graphs for confirming the average mobility according to the irradiation time of ultraviolet light of the thin film.

FIG. 11 is a graph showing a mobility, a threshold voltage $(V_t)$, and a swing (sub-threshold swing, SS) of the respective heat-treated and the UV-irradiated thin film transistors with IGZO, IZO, and the $In_2O_3$. FIG. 12 is graphs for confirming the average mobility according to the irradiation time of ultraviolet light of the thin film. In a and b, 20 IGZO TFTs were made on the silicon wafer with the ultraviolet irradiation time of respective 30 minutes, 60 minutes, 90 minutes, 120 minutes and each mobilities statistically were analyzed. In c and d, 20 $In_2O_3$ TFTs were made on the silicon wafer with the ultraviolet irradiation time of respective 30 minutes, 60 minutes, 90 minutes, 120 minutes and each mobilities statistically were analyzed.

FIG. 13 shows the average mobility characteristic according to the irradiation time of ultraviolet light in the IGZO, IZO, the $In_2O_3$, the ZTO IZTO etc. as the channel layer of the thin film transistor.

As shown in FIGS. 12 and 13, it confirms that the thin film transistor irradiated for 90 minutes to 120 minutes was excellent. This phenomenon could happen in the oxide semiconductor having the other metal. The excellent thin film transistor property was shown in case of conducting irradiation for 90 through 120 minutes.

Experimental Example 3

Figure 14:
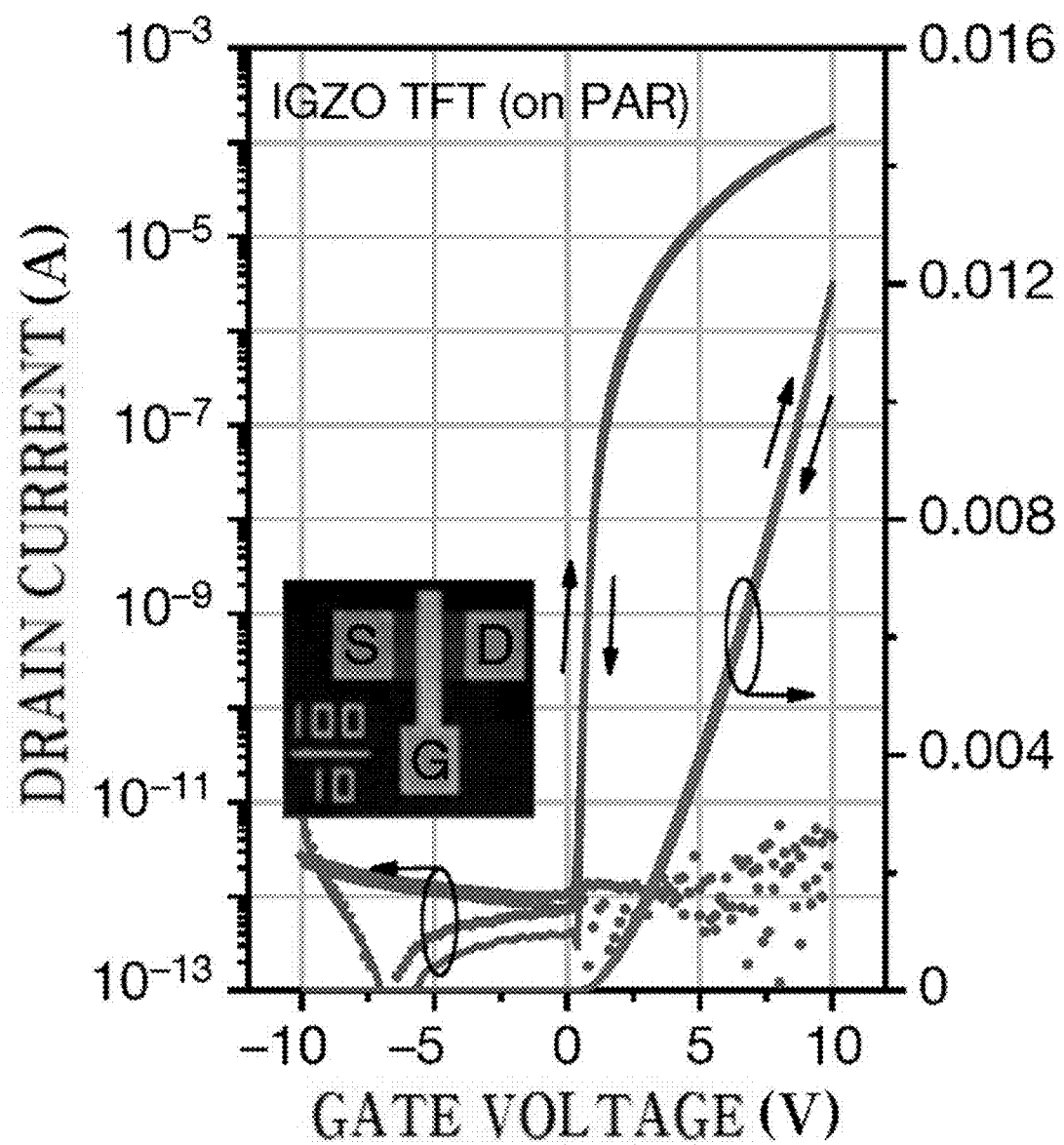
FIG. 14 shows the typical property of the thin film transistor manufactured on the PAR film.
Figure 15:
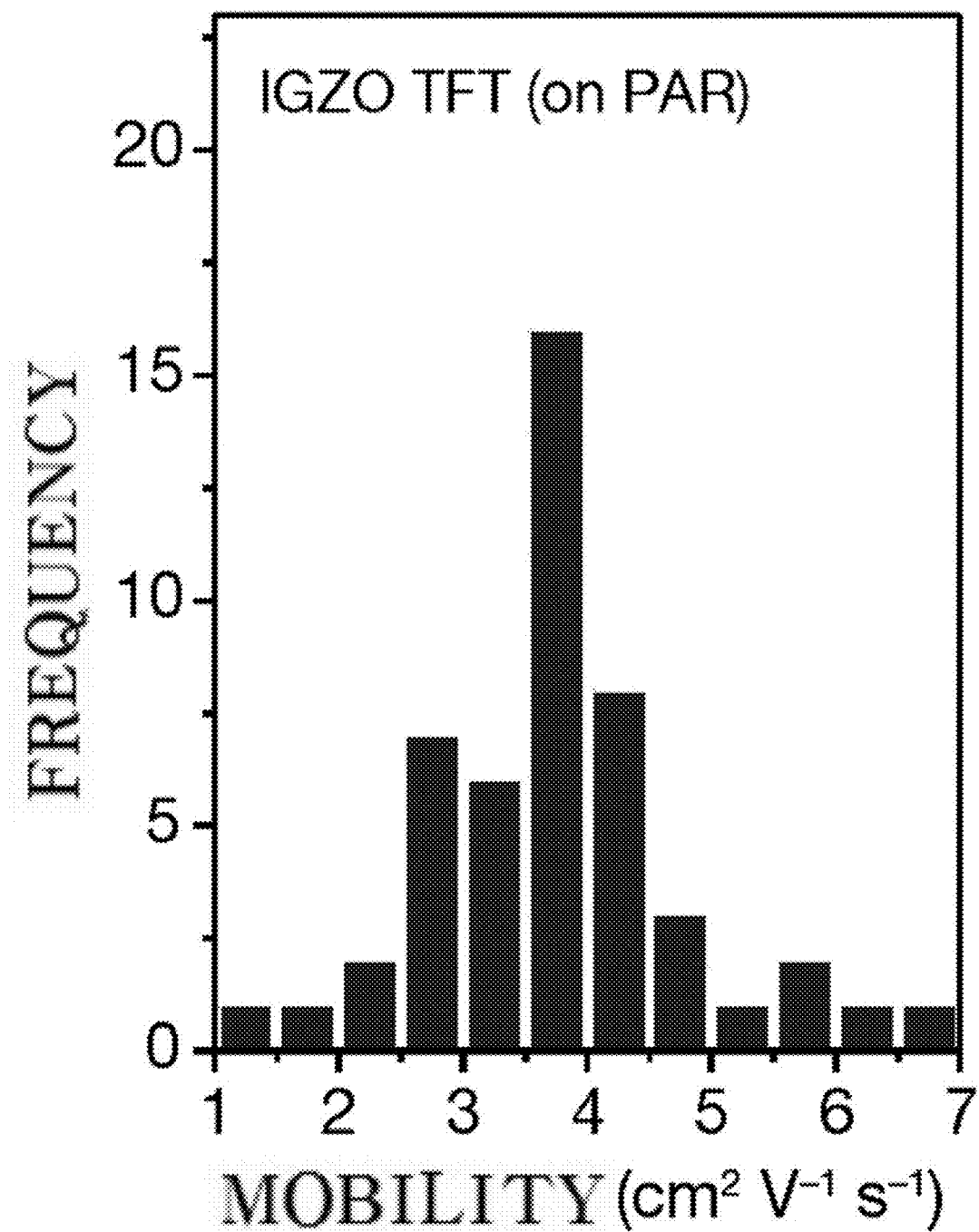
FIG. 15 is a graph showing the distribution of the saturated electric field mobilities of 49 thin film transistors.

The thin film transistor was manufactured on the flexible printed circuit board. The device was commercially made on the commercial PAR (Polyarylate) film. FIG. 14 shows the typical property of the thin film transistor manufactured on the PAR film. FIG. 15 is a graph showing the distribution of the saturated electric field mobilities of 49 thin film transistors. Referring to FIG. 15, the electric field effect mobility is distributed around 3.77 $cm^2V^{-1}s^{-1}$, the on/off rate, the swing (sub-threshold swing, SS), the threshold voltage ($V_{th}$) is the respective $10^8$, 95.8±20.8 mV per decade, and about 2.70±0.47 V.

We performed positive gate bias stress ($V_{gs}$=5V, $V_{ds}$=0.1V) by applying the positive voltages to gate electrode. The stability of the device was investigated. The tests were conducted with UV-irradiated device (on glass), UV-irradiated device (Unpassivated) which did not have the protective film (passivation) in the outside of the device, UV-irradiated device (Passivated) polymethyl methacrylate, PMMA passivation, heat-treated device (on glass) manufactured on the glass substrate in 350.

Figure 16:
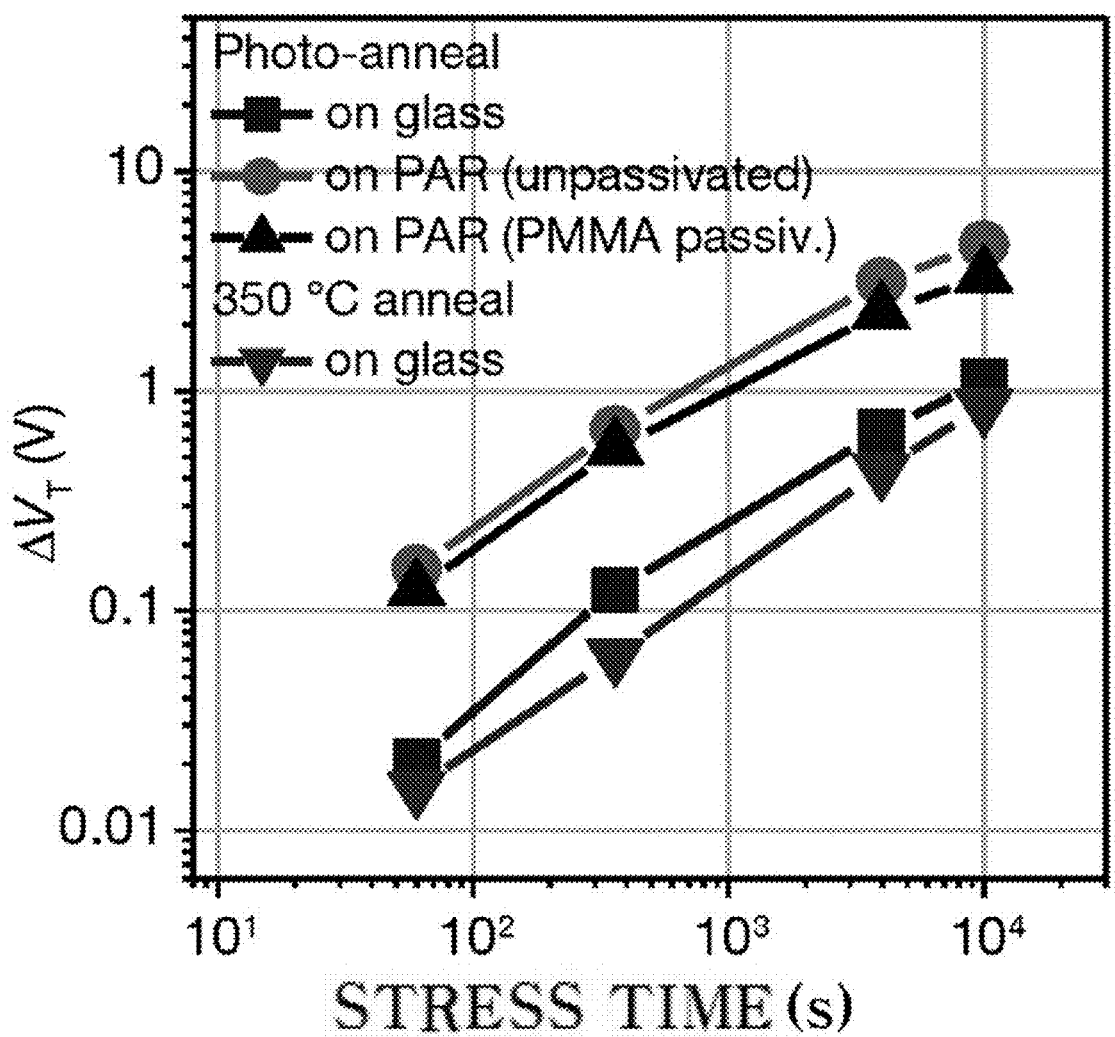
FIG. 16 is a graph which investigates the stability of the device after applying the positive voltage to the gate of the IGZO thin film transistors.

FIG. 16 is a graph which investigates the stability of the device after applying the positive voltage to the gate of the IGZO thin film transistors. The condition of the stress is $V_{gs}$=5V, and $V_{ds}$=0.1V. Referring to FIG. 16, the threshold voltage change of the ultraviolet irradiated device with PMMA film is about 1.12V after 10,000 seconds. The thermal annealed device is changed in 350° C. with 0.86V. The nearly similar threshold variation is shown.

Figure 17:
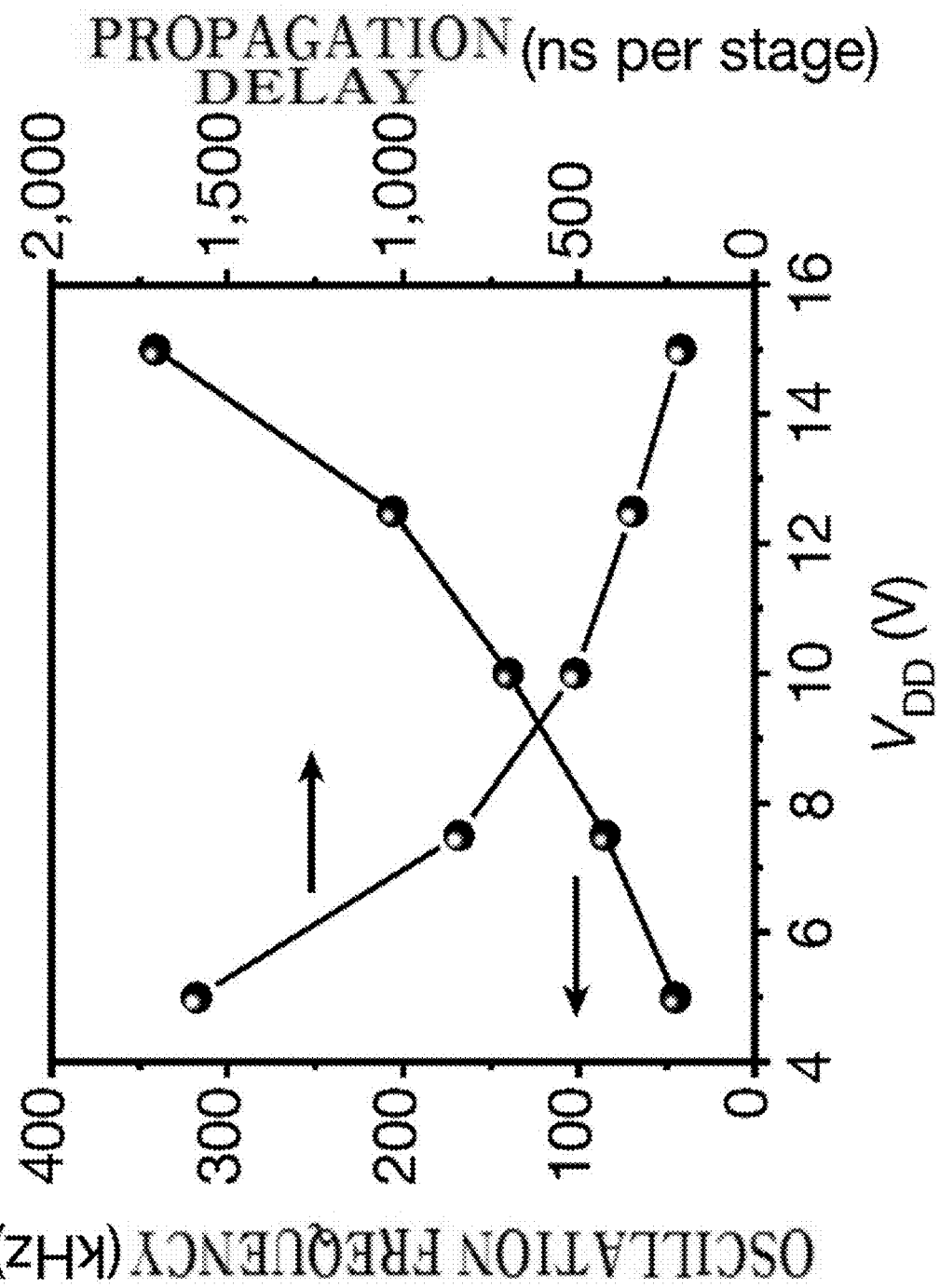
FIG. 17 is a graph showing the ring oscillator frequency according to the power supply voltage $V_{DD}$ of the invention.
Figure 18:
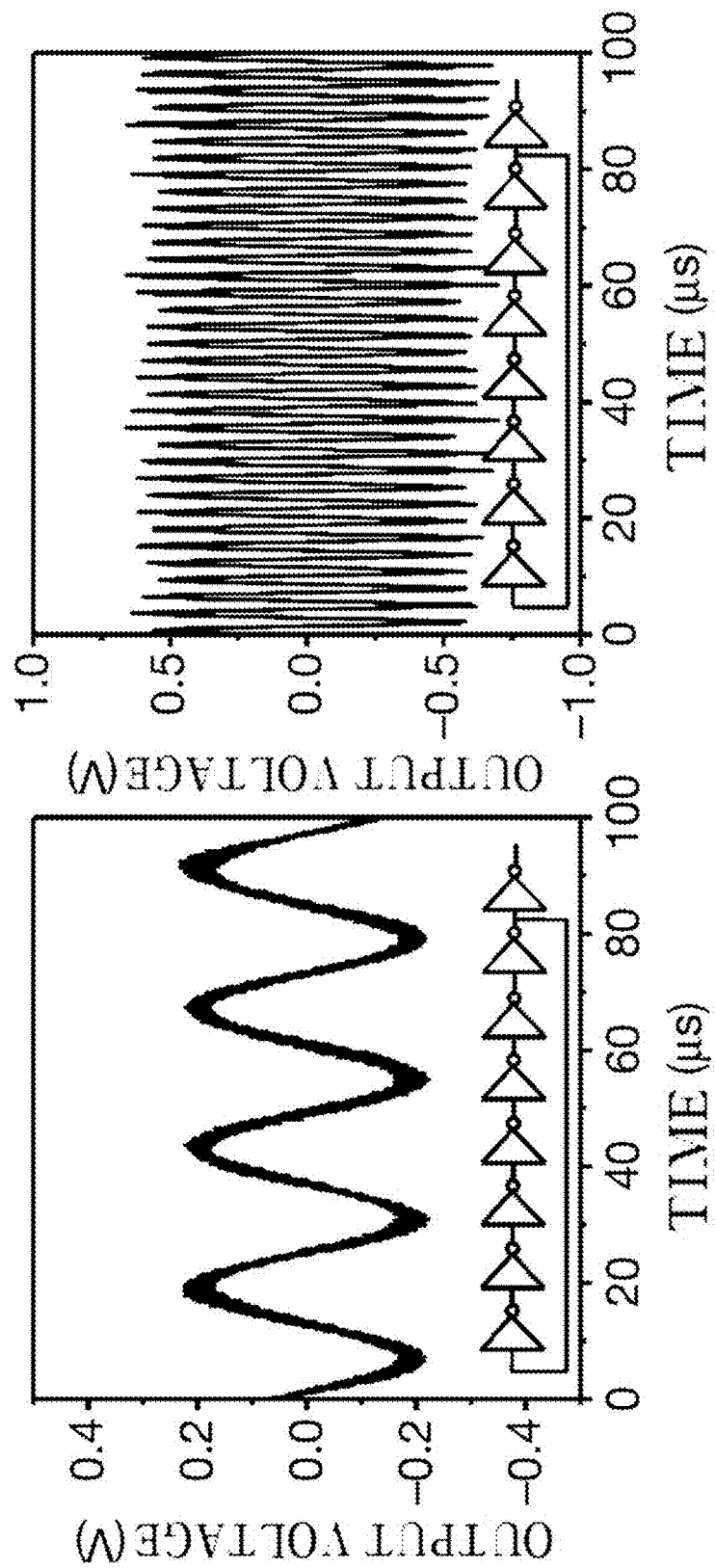
FIG. 18 is a graph showing that output voltage oscillates in case $V_{DD}$ is 5V (left), $V_{DD}$ is 15V (right).

Next, the ring oscillator was manufactured in order to confirm the reliability of the thin film transistor which was made with UV irradiation. The inverter of the ring oscillator has β rate of 2 and the width-to-length of the channels are $(W/L)_{drive}$=100 µm/7 µm, and $(W/L)_{load}$=50 µm/7 µm and it has the overlap of the gate source/drain electrode of 5 µm. FIG. 17 is a graph showing the ring oscillator frequency according to the power supply voltage $V_{DD}$ of the invention. FIG. 18 is a graph showing that output voltage oscillates in case $V_{DD}$ is 5V (left), $V_{DD}$ is 15V (right).

With a supply voltage of $V_{DD}$ of 15 V, we measured an oscillation frequency greater than, 340 kHz, and corresponding propagation delay less than, 210 ns per stage. Referring to FIG. 18, it can confirm that the output voltage oscillates in case $V_{DD}$ is 5 V (the left), 15 V (right). The oscillation frequency was measured at the respective 45 Hz and 341 KHz.

While the embodiments of the present invention has been described and shown as set above, it will be understood by those skilled in the art that various changes and modifications may be through addition, changes, deletion, or supplement without departing from the scope of the invention as defined in the following claims, and these are intended to be embraces by the scope of the claims of the present invention.

The invention claimed is:

1. A method for forming a metal oxide thin film using a low-temperature process, the method comprising:
   coating a metal oxide solution on a substrate; and
   irradiating the coated metal oxide solution with an ultraviolet light of 150 nm to 260 nm in an inert gas atmosphere to form a metal oxide semiconductor layer, and before the ultra-violet irradiation, the coated solution on the substrate is heat-treated and stabilize;
   wherein the metal oxide solution comprises at least one of Zinc precursor, Gallium precursor, Indium precursor, Tin precursor or their derivatives, the metal oxide semiconductor layer is an n-type semiconductor layer and a channel layer for an electronic device, and wherein the irradiating the coated metal oxide solution with ultra-violet light comprises:
   forming at least a partial network of more than 50% metal-oxide-metal bond inside the metal oxide solution; and removing an impurity of the oxide.

2. The method according to claim 1, wherein the metal coated oxide solution is subjected to the inert gas atmosphere without a vacuum process.

3. The method according to claim 1, wherein the inert gas is nitrogen, argon, or helium.

4. The method according to claim 1, wherein the metal oxide solution includes a metal precursor solution, and the metal precursor solution is 2-methoxyethanol (2-Methoxyethanol) or DE-ionized water (Deionized water).

5. The method according to claim 1, wherein a wavelength of the ultra-violet light is 150 nm to 260 nm.

6. The method according to claim 5, wherein the wavelength of the ultra-violet light is 160 nm to 190 nm.

7. The method according to claim 1, further comprising:
   varying a temperature of the substrate one or more of before or at the same time as the ultra-violet irradiation.

8. The method according to claim 1, wherein the coated metal oxide solution is irradiated with ultra-violet light for 1.0 minutes to 240 minutes.

9. The method according to claim 8, wherein the coated metal oxide solution is irradiated with ultra-violet light for 30 minutes to 120 minutes.

10. The method according to claim 8, wherein the coated metal oxide solution is irradiated with ultra-violet light for 90 minutes to 120 minutes.

11. The method according to claim 1, wherein the metal oxide thin film is a channel layer.

12. The method according to claim 1, wherein coating the metal oxide solution on the substrate comprises one or more of spin coating, dip-coating, inkjet printing, offset printing, reverse offset printing, gravure printing, or roll printing.

13. The method according to claim 1, wherein
   the Zinc precursor comprising zinc chloride, Zinc acetate, Zinc acetate hydrate, Zinc nitrate, Zinc nitrate hydrate, Zinc alkoxide or a derivative thereof;
   the Gallium precursor comprising Gallium nitrate, Gallium nitrate hydrate, Gallium acetate, Gallium acetate hydrate, Gallium alkoxides, or a derivative thereof;
   the Indium precursor comprising indium chloride, indium acetate, indium acetate hydrate, indium nitrate, or indium alkoxide; or
   the Tin precursor comprising Tin chloride, Tin acetate, Tin nitrate, Tin alkoxides, a derivative thereof, or a mixture thereof.

14. A metal oxide thin film manufactured by the method of claim 1.

15. An electric device including the metal oxide thin film manufactured by the method of claim 1.

16. A metal oxide thin film manufactured by the method of claim 13.

17. An electric device including the metal oxide thin film manufactured by the method of claim 13.

* * * * *